July 31, 1962 B. RANKY 3,047,823

TUNABLE PIEZO-ELECTRIC CRYSTAL

Filed May 7, 1959

INVENTOR

BELA RANKY

BY Nururtz & Rose

ATTORNEYS

United States Patent Office 3,047,823
Patented July 31, 1962

3,047,823

TUNABLE PIEZO-ELECTRIC CRYSTAL

Bela Ranky, Flushing, N.Y., assignor to Panoramic Radio Products, Inc., Mount Vernon, N.Y., a corporation of New York Filed May 7, 1959, Ser. No. 811,577
9 Claims. (Cl. 333—72)

The present invention relates generally to piezo-electric crystal filters, and more particularly to tunable piezo-electric crystal filters.

A variety of crystal filters exists in the art, which depend essentially on the selectivity of a piezo-electric crystal. Such filters find many and diverse applications, one of which is in the intermediate frequency amplifiers of frequency scanning spectrum analyzers.

In any application of a piezo-electric filter, precision of frequency response may be a predominant consideration, so that if a crystal filter varies its frequency response due to aging, which is common, devices must be provided for returning the filter to its correct frequency. This implies modifying the resonant frequency of the piezo-electric crystal, and it is preferable to do so without modifying its selectivity characteristic in respect to shape.

It is also a problem, in manufacturing a large quantity of piezo-electric crystal filters, to obtain the requisite crystals with precise uniformity of frequency response. Facilities for tuning the filters by adjusting the resonant frequency of the included crystals are accordingly required, and the adjusting operation must leave the shape of the selectivity curve of the crystal unaltered.

Where cascaded crystal filters are included in an electronic equipment, as in I.F. amplifiers, the necessity for a simple device for tuning crystals may be particularly acute since two cascaded crystal filters having selectivity curves which do not substantially coincide may provide a resultant or overall selectivity characteristic which is completely unacceptable. Systems of tuning piezo-electric crystal filters which produce variations of amplitude of response, or of band width, as a concomitant to any change in frequency, are accordingly undesirable, and in many applications unacceptable.

It is an object of the present invention to provide a system for electrically varying the resonant frequency of a piezo-electric crystal included in a filter or drive circuit, without substantial concurrent variation of the shape of its selectivity curve, and particularly of the amplitude of its response to a given input signal.

Briefly describing the present invention, a piezo-electric crystal is provided with two pairs of electrodes. One pair of electrodes is connected in a filter circuit so as to determine its frequency response. The other pair of electrodes is connected across a tuning condenser, but is disconnected from the filter circuit. It is then found that variation of capacity of the tuning condenser varies the resonant frequency of the filter, but does not substantially affect the selectivity characteristic of the filter, or of the crystal considered as a filter element, except for a shift of the characteristic along the frequency axis. The response of the filter in respect to amplitude and width of selectivity curve is unaffected, and only its frequency is shifted.

It is, accordingly, an object of the present invention to provide a system for varying the resonant frequency of a piezo-electric crystal.

It is another object of the present invention to provide a system for varying the resonant frequency of a piezo-electric crystal without varying the selectivity of the crystal.

It is a further object of the invention to provide a system for varying the resonant frequency of a piezo-electric crystal in response to variation of capacity of a condenser located remotely of the crystal.

A further object of the invention resides in the provision of a piezo-electric crystal having two pairs of electrodes, one of the pairs of electrodes being connected to a filter for determining the resonant frequency of the filter, and the other pair of electrodes being connected solely across a variable impedance, preferably a capacitance, variation of which serves to vary the frequency of response of the filter substantially without varying its selectivity characteristics.

The above and still further objects, features and advantages of the present invention will become apparent upon consideration of the following detailed description of one specific embodiment thereof, especially when taken in conjunction with the accompanying drawings, wherein.

While the present invention may find particular application in intermediate frequency amplifiers of scanning spectrum analyzers, and more specifically to the intermediate frequency filters found in such amplifiers, its utility is not so restricted, but the invention may be applied to filters of any character, providing these use piezo-electric crystals as frequency determining elements, and more broadly may be utilized for varying the resonant frequency of a piezo-electric crystal regardless of the application which is being made of the crystal.

Figure 1:
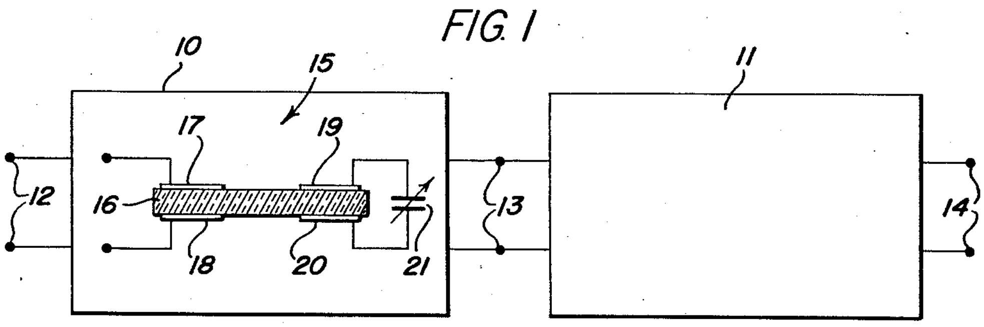
FIGURE 1 is a circuit diagram, partially schematic, of a filter arrangement in accordance with the present invention.

Referring now more specifically to FIGURE 1 of the accompanying drawings, there is illustrated two I.F. filters 10 and 11, which are connected in cascade. Normally, such I.F. filters are active, or contain active elements, but it does not go to the essence of the present invention that the filters be active.

The filter 10 includes input terminals 12 and output terminals 13, the filter 11 having the terminals 13 as its input terminals and being provided with output terminals 14. The filters 10 and 11 may be duplicates, and accordingly only the internal structure of the filter 10 is described herein.

The filter 10 is illustrated generally in block form except in respect to the crystal tuning element 15. The character of the illustration is intended to stress the universal character of the invention, as being independent of any specific or particular filter configuration. For purpose of example, reference may be made to a crystal filter illustrated and described in a textbook entitled, "Radio Engineering," the author of which is F. E. Terman, and which was published by McGraw-Hill Book Co., Inc., in 1947. The filter there described, at page 762, FIG. 15–24, is described as a typical crystal filter in a radio receiver.

The crystal 15 includes a piezo-electric block or plate 16 of piezo-electric material, which is ground in any one of the several modes available for such crystals, when intended for utilization in filters, and more specifically to a resonance frequency equal to the desired pass frequency of the I.F. filter 10. The plate 16 of piezo-electric material separates a pair of electrodes 17 and 18, which are normally plated on the plate 16. The electrodes 17 and 18, in accordance with the present invention, occupy less than the total area of the plate 16, so that space is available on the plate 16 for a further pair of electrodes 19 and 20.

The matter of relative areas of electrodes 17, 18 in comparison with the area of electrodes 19, 20 is a matter of design, in any specific application, i.e., depend largely on the extent of tuning desired. Piezo-electric crystals with the required plated areas, are, however, commercially available for a relatively wide range of frequencies, in which the respective plate areas are equal. Connected across the electrodes 19, 20 is a variable condenser 21.

It is now found that variation of capacity of the condenser 21 varies the resonant frequency of the piezo-electric crystal 16, as seen between the plates 17, 18, without substantially varying the selectivity characteristic of the filter 10 or of the piezo-electric crystal 15. Many devices are known for varying the effective resonant frequency of a piezo-electric crystal. These have not to my knowledge been as simple in their implementation as is the present device, nor have they had the characteristic of leaving unmodified the selectivity characteristic of the crystal. In general, when a crystal has been detuned from its natural frequency, the response of the crystal to a given amplitude of input signal has been reduced. In accordance with the present invention this effect does not occur, but the amplitude of response and also the width of the selectivity curve remain constant.

Figure 2:
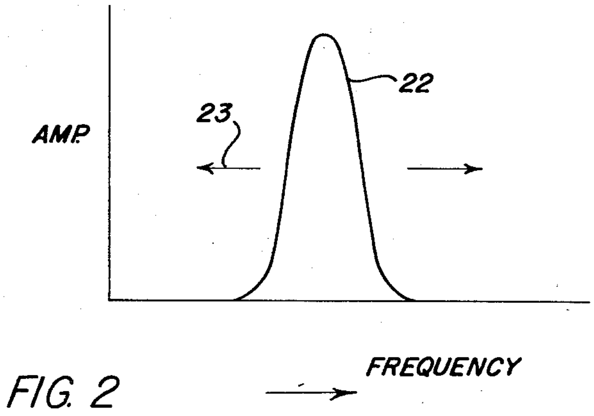
FIGURE 2 is a plot of the selectivity characteristic of the filter of FIGURE 1.

The above described properties in the present system are exemplified in FIGURE 2 of the accompanying drawings, which shows a conventional selectivity curve for a crystal filter, or for the piezo-electric crystal element thereof, at 22. The arrows 23 are intended to indicate that the position of the entire selectivity characteristic 22 shifts along the frequency axis of the plot, without change of shape, in response to a variation of the capacity of the condenser 21.

Where crystal filters are connected in cascade, and the selectivity curves of the crystals are arranged to be extremely sharp, say of the order of 0.1 c.p.s. or 1.0 c.p.s., the problem of maintaining the pass frequencies of the filters, as 10, 11, precisely matched, is an extremely difficult one because any slight relative detuning of the filter stages as a result of aging or of variation of ambient conditions, results in a filter which has no overall pass band, or an extremely distorted overall pass band. Furthermore, in manufacturing such cascaded filters, where the crystals are purchased commercially, it is found that their resonant frequencies are seldom precise. Even the slightest variation from true frequency results in a serious modification of the overall pass band of the cascaded filters. It is therefore extremely desirable, from a manufacturing viewpoint, that economical and effective devices be available for adjusting only the resonant frequencies of piezo-electric crystals embodied in cascaded filters or cascaded amplifiers. The present invention provides such a device.

I do not desire, however, to be limited to application of the invention to cascaded amplifiers, since my invention may provide tuning in single stage crystal-filters or in single stage crystal-filter controlled amplifiers, or in crystal controlled oscillators or in crystal transducers. While many applications exist for piezo-electric crystals, apart from applications to filter circuits, in any such application tuning of the filter without degrading its response may be a matter of considerable importance, and the present invention finds application to such utilization.

While I have disclosed the present invention as employing a tuning capacitor, more complex impedances may be employed instead. Particularly, series tuned circuits may be of particular value.

I do not understand fully the reasons for the described operation of the present system. Accordingly, I do not desire to be limited to any specific theory of operation. It is, however, my opinion that the halves of the crystal plates lying between the respective pairs of electrodes are mechanically coupled through the crystal, so that the driven circuit and the tuning capacity are coupled in some complex manner, resulting in a reaction on the driven part of the crystal by the current flowing in the tuning capacitor. This reaction is such as to give rise to a variation of resonance frequency.

The two pairs of electrodes must not necessarily be of equal dimensions. The shape and the relative placement on electrodes can take any form or arrangement.

I also find that the variable capacity employed for varying the tuning of a crystal may be voltage sensitive, so that tuning may be accomplished by varying the value of a D.C. voltage connected across the tuning condenser.

The variation of crystal frequency with capacity of condenser 21 is not linear, but includes a region of high slope and a region of low slope. This characteristic may be made use of to provide relatively fine or relatively coarse tuning.

The invention has been applied to a wide variety of crystal cuts, and modes of vibration, and appears to operate universally. Crystal frequencies from 100 kc. to 10 mc. have been employed with success.

Moreover, not only four terminal, but also three terminal crystals may be employed, i. e., those having one electrode on one side of the crystal and a split electrode on the other side.

*Range of tuning capacities employed in 5–100 mμ F.*—For a 100 kc. crystal a change of 60 c.p.s. is obtained for a variation of 5–100 mμ F. of tuning capacity, while for a 10 mc. crystal and the same variation of tuning capacity crystal frequency changes 6,000 c.p.s., crystal frequency decreasing with increase of tuning capacity.

Figure 3:
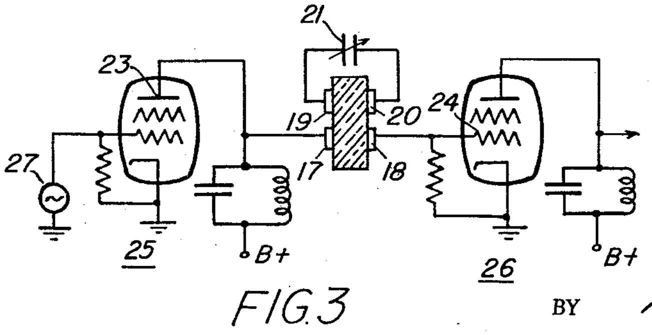
FIG. 3 is a schematic diagram of one specific circuit in which the present invention may be employed.

In certain experimental work, the 100 kc. crystal was of 5°X, and the 10 mc. crystal was of ATA type, the modes of vibration being, respectively, length extensional and thickness shear. FIG. 3 discloses a specific example of the manner in which a filter constructed according to the principles of the present invention may be constructed. The filter comprises crystal 16 having opposed electrodes 17 and 18, respectively connected to the plate 23 and grid 24 of cascaded I.F. stages 25 and 26. An I.F. signal 27 is supplied to the grid of I.F. stage 25 and coupled to the grid of I.F. stage 26 via crystal 16 and electrodes 17 and 18.

Crystal 16 is resonant to a frequency within the bandpass of stages 25 and 26. The crystal is included between stages 25 and 26 to prevent passage only of its resonant frequency between the two stages. It is desired to pass all other frequencies within the bandpass of stages 25 and 26, if possible. In the present invention, accurate control of the resonant frequency of crystal 16 is achieved by variable capacitor 21, connected across auxiliary crystal electrodes 19 and 20. Capacitor 21 translates the crystal resonant frequency as shown in FIGURE 2 but does not change its characteristic. Thus the crystal remains at a high Q and great selectivity of frequency rejection is accomplished between I.F. stages 25 and 26.

While I have described and illustrated one specific embodiment of my invention, it will be clear that variations of the general arrangement and of the details of construction which are specifically illustrated and described may be resorted to without departing from the true spirit and scope of the invention, as defined in the appended claims.

What I claim is:

1. A piezo-electric system comprising a piezo-electric crystal having two pairs of electrodes, a load for said system, means coupled to only one of said pair of electrodes for supplying energy to said crystal substantially at the crystal resonant frequency and for supplying said energy to said load, and tuning means coupled to the other of said pair of electrodes for controlling the resonant frequency of said crystal.

2. The combination of claim 1 wherein the electrodes of said other pair of electrodes are opposed to each other and electrically unconnected to said at least one pair of electrodes.

3. The combination of claim 1 wherein said tuning means is a capacitance.

4. The combination of claim 1 wherein said tuning means is a variable capacitance.

5. The combination according to claim 1 wherein said crystal is resonant at approximately 100 kc. and said variable capacitance has a range of values from 5 to 100 micromicrofarads.

6. The combination according to claim 1 wherein said piezo-electric crystal is resonant in the range 100 kc. to 10 mc. and said capacitance has a range of values falling between 5 and 100 micromicrofarads.

7. The combination of claim 1 wherein said crystal is resonant to a single frequency.

8. A piezo-electric system comprising a piezo-electric crystal having two pairs of separate, opposed electrodes, means coupled to only one of said pair of electrodes for supplying and removing energy substantially at the crystal resonant frequency, and only tuning means coupled to the other of said pair of electrodes for varying the resonant frequency of said crystal, said last named means consisting of a variable reactive element.

9. A piezo-electric system comprising a piezo-electric crystal having two pairs of separate, opposed electrodes, means coupled to only one of said pair of electrodes for supplying and removing energy at substantially the crystal resonant frequency and only an element consisting of a variable reactance connected across the other of said pair of electrodes for tuning said crystal.

References Cited in the file of this patent

UNITED STATES PATENTS

| | | |
|---|---|---|
| 1,450,246 | Cady | Apr. 3, 1923 |
| 2,271,870 | Mason | Feb. 3, 1942 |

FOREIGN PATENTS

| | | |
|---|---|---|
| 603,375 | Germany | Sept. 29, 1934 |